(12) United States Patent
Aboudina et al.

(10) Patent No.: US 10,873,486 B1
(45) Date of Patent: Dec. 22, 2020

(54) RECEIVER CIRCUITS WITH BLOCKER ATTENUATING RF FILTER

(71) Applicant: GOODIX TECHNOLOGY INC., San Diego, CA (US)

(72) Inventors: Mohamed Aboudina, San Diego, CA (US); Ahmed Emira, San Diego, CA (US); Esmail Babakrpur Nalousi, San Diego, CA (US)

(73) Assignee: GOODIX TECHNOLOGY INC., San Diego, CA (US)

( * ) Notice: Subject to any disclaimer, the term of this patent is extended or adjusted under 35 U.S.C. 154(b) by 0 days.

(21) Appl. No.: 16/749,996

(22) Filed: Jan. 23, 2020

(51) Int. Cl.
*H04B 1/10* (2006.01)
*H04B 1/16* (2006.01)
*H04L 27/14* (2006.01)
*H04B 1/12* (2006.01)
*H03F 3/189* (2006.01)

(52) U.S. Cl.
CPC ............. *H04L 27/14* (2013.01); *H03F 3/189* (2013.01); *H04B 1/12* (2013.01); *H04B 1/16* (2013.01); *H03F 2200/165* (2013.01); *H03F 2200/294* (2013.01); *H03F 2200/451* (2013.01)

(58) Field of Classification Search
CPC .......... H04B 1/10; H04B 1/1027; H04B 1/16
See application file for complete search history.

(56) References Cited

U.S. PATENT DOCUMENTS

| | | | | |
|---|---|---|---|---|
| 8,655,299 | B2* | 2/2014 | Mirzaei | H03F 1/083 455/307 |
| 2011/0299433 | A1* | 12/2011 | Darabi | H04B 1/525 370/277 |
| 2011/0299574 | A1* | 12/2011 | Rofougaran | H03D 7/1483 375/219 |
| 2011/0300885 | A1* | 12/2011 | Darabi | H04B 1/52 455/500 |
| 2013/0115904 | A1* | 5/2013 | Kapoor | H04B 1/109 455/234.1 |

* cited by examiner

*Primary Examiner* — Blane J Jackson
(74) *Attorney, Agent, or Firm* — Kilpatrick Townsend & Stockton LLP

(57) ABSTRACT

A receiver circuit is disclosed. The receiver circuit includes an amplifier configured to generate an RF signal based on a received signal, where the RF signal includes an information signal and a blocker signal modulating an RF carrier frequency. The receiver circuit also includes an RF filter connected to the amplifier, where the RF filter is configured to selectively attenuate the blocker signal.

14 Claims, 2 Drawing Sheets

RECEIVER CIRCUITS WITH BLOCKER ATTENUATING RF FILTER

FIELD OF THE INVENTION

The present application generally pertains to receiver circuits, and more particularly to receiver circuits which attenuate blocker signals.

BACKGROUND OF THE INVENTION

High power signals near the signal frequency are problematic for receivers, as they make it difficult for the receiver to correctly receive the transmitted signal information. Circuit techniques for attenuating blocker signals is needed in the art.

BRIEF SUMMARY OF THE INVENTION

One inventive aspect is a receiver circuit. The receiver circuit includes an amplifier configured to generate an RF signal based on a received signal, where the RF signal includes an information signal and a blocker signal modulating an RF carrier frequency. The receiver circuit also includes an RF filter connected to the amplifier, where the RF filter is configured to selectively attenuate the blocker signal.

Another inventive aspect is a method of operating a receiver circuit. The receiver circuit includes an amplifier, and an RF filter connected to the amplifier. The method includes, with the amplifier, generating an RF signal based on a received signal, where the RF signal includes an information signal and a blocker signal modulating an RF carrier frequency, and with the RF filter, selectively attenuating the blocker signal.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
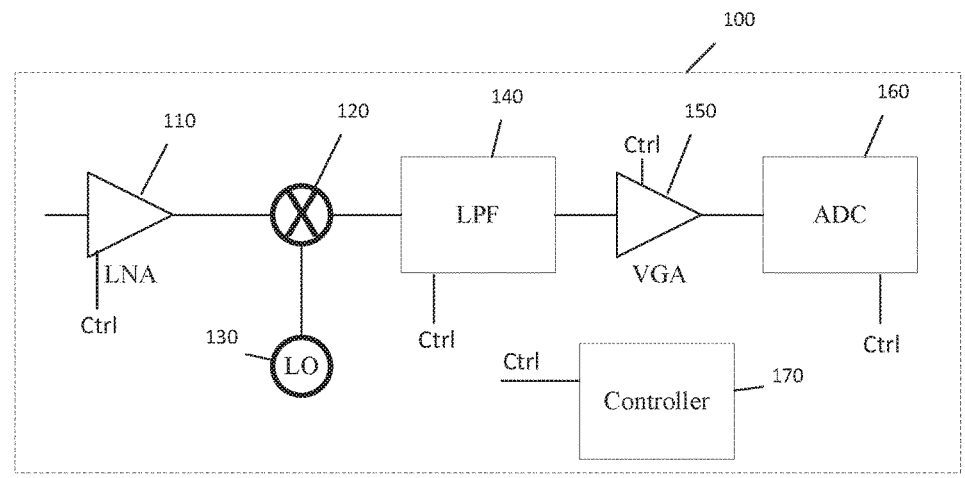
FIG. 1 is a schematic diagram of an embodiment of a receiver circuit.

FIG. 1 is a schematic diagram of an embodiment of a receiver circuit 100. Receiver circuit 100 includes low noise amplifier (LNA) 110, mixer 120 which receives an oscillator signal from oscillator 130, low-pass filter (LPF) 140, variable gain amplifier (VGA) 150, analog-to-digital converter (ADC) 160, and controller 170.

Low noise amplifier 110 is configured to receive a high-frequency carrier signal modulated with a low frequency information signal. The received signal may also include a blocker signal, such as a high power signal also modulating the high-frequency carrier signal near the frequency of the information signal. Low noise amplifier 110 may be any low noise amplifier or amplifier, as understood by those of skill in the art.

In response to the output from the low noise amplifier 110 and the oscillator signal, mixer 120 down converts the signal from the low noise amplifier 110. The resulting baseband signal includes information of the low frequency information signal and of the blocker signal.

The baseband signal is then processed by the low-pass filter 140. Because of the blocker signal, signals at the low-pass filter 140 may exceed an input or output range limit, such that signals at the input, the output, or internal to the low-pass filter 140 experience clipping, as understood by those of skill in the art. Using techniques known to those of skill in the art, the clipping may be detected, and communicated to controller 170. In response to the detected clipping, controller 170 may generate control signals for low-pass filter 140 to attenuate the baseband signal such that the signal range limit is no longer exceeded, and the clipping stops.

In some embodiments, the low-pass filter 140 does not detect whether the baseband signal exceeds a signal range limit.

The baseband signal is then processed by the variable gain amplifier 150. Because of the blocker signal, signals at the variable gain amplifier 150 may exceed an input or output range limit, such that signals at the input, the output, or internal to the variable gain amplifier 150 experience clipping. Using techniques known to those of skill in the art, the clipping may be detected, and communicated to controller 170. In response to the detected clipping, controller 170 may generate control signals for variable gain amplifier 150 to attenuate the baseband signal such that the signal range limit is no longer exceeded, and the clipping stops. Additionally or alternatively, in response to the detected clipping, controller 170 may generate control signals for low-pass filter 140 to attenuate the baseband signal such that the signal range limit is no longer exceeded, and the clipping stops.

In some embodiments, variable gain amplifier 150 does not detect whether the baseband signal exceeds a signal range limit.

The baseband signal is then processed by the analog-to-digital converter 160. Because of the blocker signal, signals at the analog-to-digital converter 160 may exceed an input or output range limit, such that signals at the input, the output, or internal to the analog-to-digital converter 160 experience clipping. Using techniques known to those of skill in the art, the clipping may be detected, and communicated to controller 170. In response to the detected clipping, controller 170 may generate control signals for analog-to-digital converter 160 to attenuate the baseband signal such that the signal range limit is no longer exceeded, and the clipping stops. Additionally or alternatively, in response to the detected clipping, controller 170 may generate control signals for variable gain amplifier 150 to attenuate the baseband signal such that the signal range limit is no longer exceeded, and the clipping stops. Additionally or alternatively, in response to the detected clipping, controller 170 may generate control signals for low-pass filter 140 to attenuate the baseband signal such that the signal range limit is no longer exceeded, and the clipping stops.

In some embodiments, the analog-to-digital converter 160 does not detect whether the baseband signal exceeds a signal range limit.

As understood by those of skill in the art, the control signals from controller 170 may cause one or more gain elements to attenuate the blocker signal. Additionally or alternatively, as understood by those of skill in the art, the control signals from controller 170 may cause one or more filtering elements to filter the blocker signal by, for example, moving a pole of the one or more filtering elements.

Figure 2:
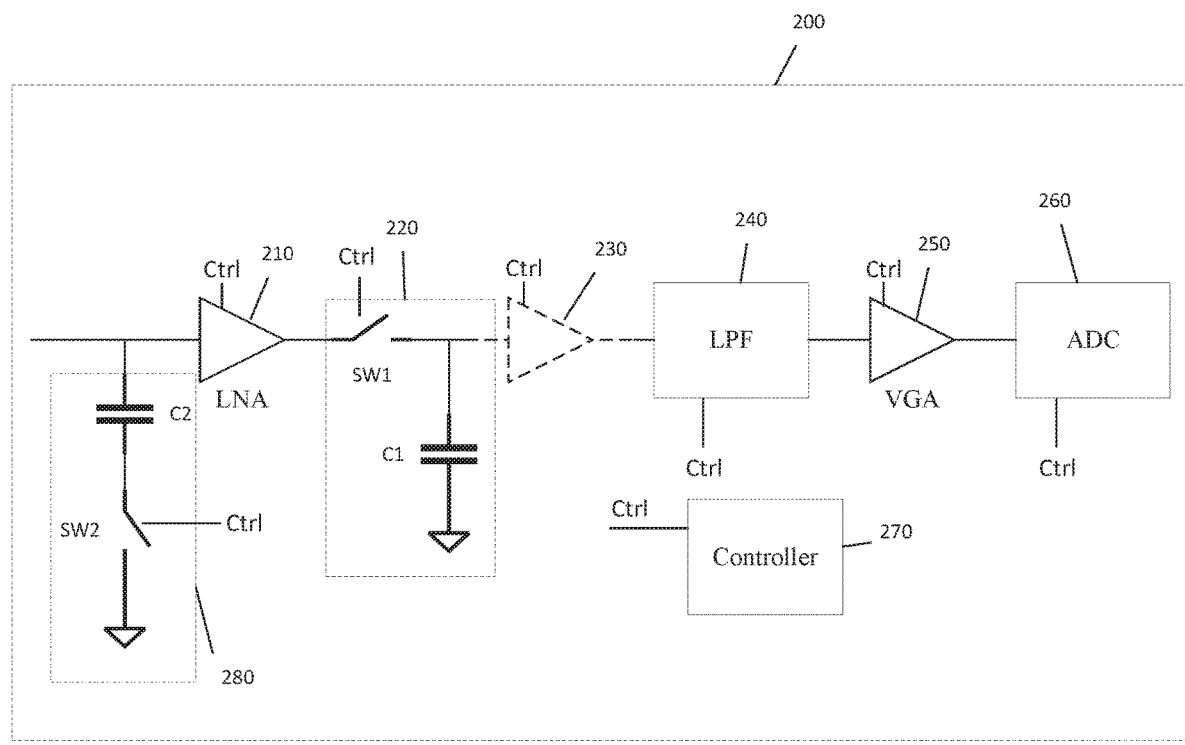
FIG. 2 is a schematic diagram of another embodiment of a receiver circuit.

FIG. 2 is a schematic diagram of another embodiment of a receiver circuit 200. Receiver 200 includes low noise amplifier (LNA) 210, single-phase filter 280, mixer 220, optional buffer 230, low-pass filter (LPF) 240, variable gain amplifier (VGA) 250, analog-to-digital converter (ADC) 260, and controller 270.

Low noise amplifier 210 is configured to receive a high-frequency carrier signal modulated with a low frequency information signal as filtered by single-phase filter 280. In some embodiments, the filtering of single-phase filter 280 is sufficient, that a SAW filter (or other similar) filter is not used to filter the high-frequency carrier signal prior to its being received by receiver 200.

In some embodiments, low noise amplifier 210 includes a matching network, as understood by those of skill in the art. In some embodiments, the high-frequency carrier signal an output of a matching network, as understood by one of skill in the art.

The received signal may also include a blocker signal, such as a high power signal also modulating the high-frequency carrier signal near the frequency of the information signal. Low noise amplifier 210 may be any low noise amplifier or amplifier, as understood by those of skill in the art.

In the illustrated embodiment, single-phase filter 280 includes capacitor C2 and switch SW2. As understood by those of skill in the art, the connection relationship between capacitor C2 and switch SW2 may be reversed, such that switch SW5 is connected to LNA 210 and capacitor C2 is connected to ground. In some embodiments, single-phase filter 280 may be a multiphase filter, such as multiphase filter 380 discussed below. As understood, at least from FIG. 2, by those of skill in the art, using communication bus Ctrl, the controller provides a signal that causes the switch SW2 to switch at a frequency, and single-phase filter 280 passes signals of frequencies less than the switching frequency from the input of LNA 210 to ground, and passes signals of frequencies greater than the switching frequency from the input of LNA 210 to ground. Accordingly, signals at the switching frequency are passed to the LNA 210.

In response to the output from the low noise amplifier 210 and single-phase filter 280, and in response to control signals from controller 270, mixer 220 down converts the signal from the low noise amplifier 210 and single-phase filter 280. In some embodiments, the resulting initial baseband signal includes information of the low frequency information signal and of the blocker signal.

The baseband signal may then be processed by optional buffer 230. Because of the blocker signal, signals at the optional buffer 230 may exceed an input or output range limit, such that signals at the input, the output, or internal to the optional buffer 230 experience clipping. Using techniques known to those of skill in the art, the clipping may be detected, and communicated to controller 270. In response to the detected clipping, controller 270 may generate control signals for optional buffer 230 to attenuate the baseband signal such that the signal range limit is no longer exceeded, and the clipping stops. Additionally or alternatively, in response to the detected clipping, controller 270 may generate control signals for single-phase filter 280 which cause single-phase filter 280 to attenuate the baseband signal such that the signal range limit is no longer exceeded, and the clipping stops.

In some embodiments, the optional buffer 230 does not detect whether the baseband signal exceeds a signal range limit.

The baseband signal is then processed by the low-pass filter 240. Because of the blocker signal, signals at the low-pass filter 240 may exceed an input or output range limit, such that signals at the input, the output, or internal to the low-pass filter 240 experience clipping. Using techniques known to those of skill in the art, the clipping may be detected, and communicated to controller 270. In response to the detected clipping, controller 270 may generate control signals for low-pass filter 240 to attenuate the baseband signal such that the signal range limit is no longer exceeded, and the clipping stops. Additionally or alternatively, in response to the detected clipping, controller 270 may generate control signals for optional buffer 230 to attenuate the baseband signal such that the signal range limit is no longer exceeded, and the clipping stops. Additionally or alternatively, in response to the detected clipping, controller 270 may generate control signals for single-phase filter 280 which cause single-phase filter 280 to attenuate the baseband signal such that the signal range limit is no longer exceeded, and the clipping stops.

In some embodiments, the low-pass filter 240 does not detect whether the baseband signal exceeds a signal range limit.

The baseband signal is then processed by the variable gain amplifier 250. Because of the blocker signal, signals at the variable gain amplifier 250 may exceed an input or output range limit, such that signals at the input, the output, or internal to the variable gain amplifier 250 experience clipping. Using techniques known to those of skill in the art, the clipping may be detected, and communicated to controller 270. In response to the detected clipping, controller 270 may generate control signals for variable gain amplifier 250 to attenuate the baseband signal such that the signal range limit is no longer exceeded, and the clipping stops. Additionally or alternatively, in response to the detected clipping, controller 270 may generate control signals for low-pass filter 240 to attenuate the baseband signal such that the signal range limit is no longer exceeded, and the clipping stops. Additionally or alternatively, in response to the detected clipping, controller 270 may generate control signals for optional buffer 230 to attenuate the baseband signal such that the signal range limit is no longer exceeded, and the clipping stops. Additionally or alternatively, in response to the detected clipping, controller 270 may generate control signals for single-phase filter 280 which cause single-phase filter 280 to attenuate the baseband signal such that the signal range limit is no longer exceeded, and the clipping stops.

In some embodiments, variable gain amplifier 250 does not detect whether the baseband signal exceeds a signal range limit.

The baseband signal is then processed by the analog-to-digital converter 260. Because of the blocker signal, signals at the analog-to-digital converter 260 may exceed an input or output range limit, such that signals at the input, the output, or internal to the analog-to-digital converter 260 experience clipping. Using techniques known to those of skill in the art, the clipping may be detected, and communicated to controller 270. In response to the detected clipping, controller 270 may generate control signals for analog-to-digital converter 260 to attenuate the baseband signal such that the signal range limit is no longer exceeded, and the clipping stops. Additionally or alternatively, in response to the detected clipping, controller 270 may generate control signals for variable gain amplifier 250 to attenuate the baseband signal such that the signal range limit is no longer exceeded, and the clipping stops. Additionally or alternatively, in response to the detected clipping, controller 270 may generate control signals for low-pass filter 240 to attenuate the baseband signal such that the signal range limit is no longer exceeded, and the clipping stops. Additionally or alternatively, in response to the detected clipping, controller 270 may generate control signals for optional buffer 230 to attenuate the baseband signal such that the signal range limit is no longer exceeded, and the clipping stops. Additionally or alternatively, in response to the detected clipping, controller 270 may generate control signals for low-pass/high-pass filter 280 which cause low-pass/high-pass filter 280 to attenuate the baseband signal such that the signal range limit is no longer exceeded, and the clipping stops.

In some embodiments, the analog-to-digital converter 260 does not detect whether the baseband signal exceeds a signal range limit.

As understood by those of skill in the art, the control signals from controller 270 may cause one or more gain elements to attenuate the blocker signal. Additionally or alternatively, as understood by those of skill in the art, the control signals from controller 270 may cause one or more filtering elements to filter the blocker signal by, for example, moving a pole of the one or more filtering elements.

Figure 3:
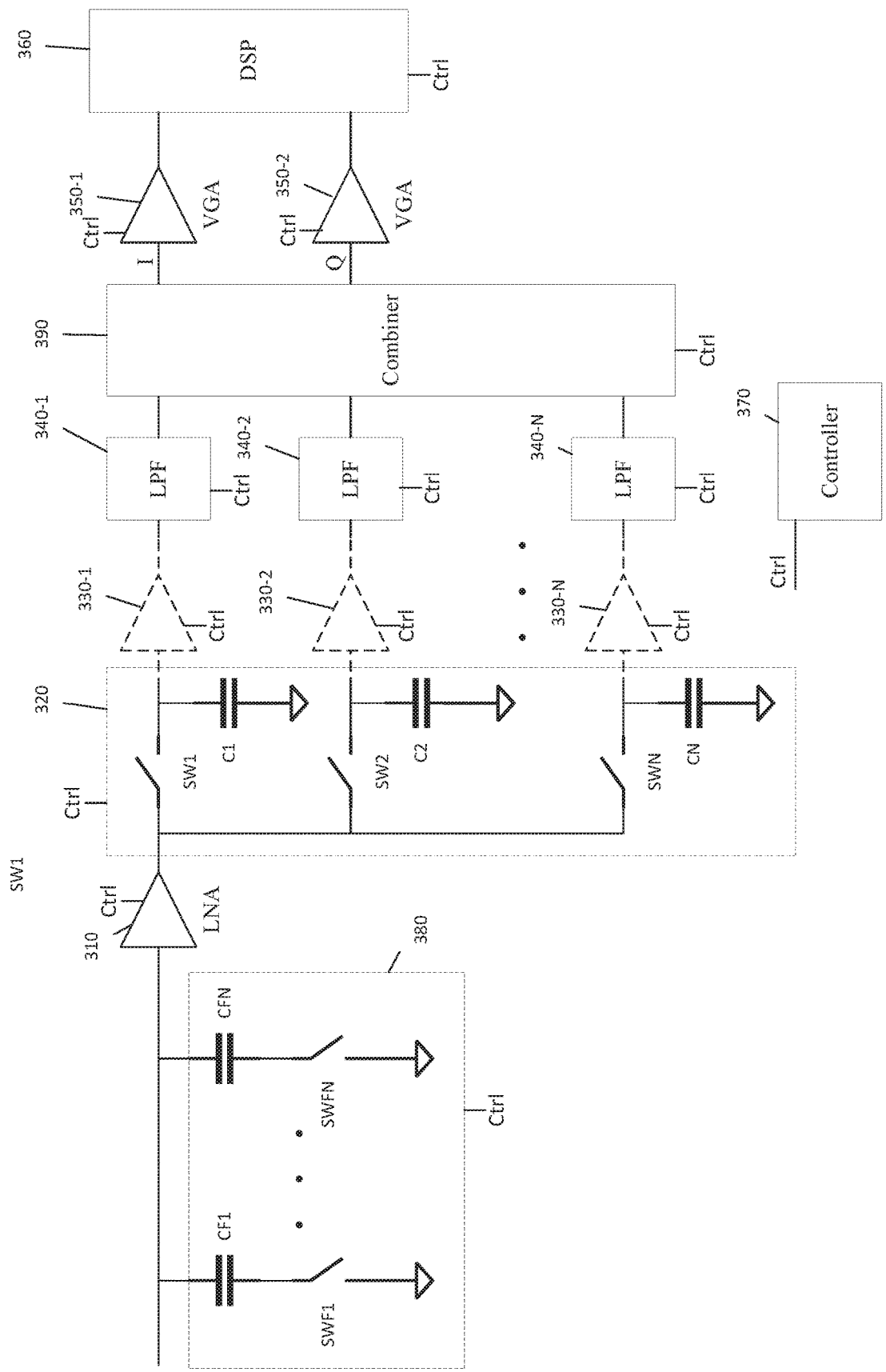
FIG. 3 is a schematic diagram of yet another embodiment of a receiver circuit.

FIG. 3 is a schematic diagram of yet another embodiment of a receiver circuit 300. Receiver 300 includes low noise amplifier (LNA) 310, multiphase filter 380, multi-phase mixer 320, optional buffers 330-1, 330-2 . . . 330-N, low-pass filters (LPF) 340-1, 340-2 . . . 340-N, combiner 390, variable gain amplifiers (VGA) 350-1 and 350-2, digital signal processor (DSP) 360, controller 370, and multiphase filter 380.

Low noise amplifier 310 is configured to receive a high-frequency carrier signal modulated with a low frequency information signal as filtered by multiphase filter 380. In some embodiments, the filtering of multiphase filter 380 is sufficient, that a SAW filter (or other similar) filter is not used to filter the high-frequency carrier signal prior to its being received by receiver 300.

In some embodiments, low noise amplifier 310 includes a matching network, as understood by those of skill in the art. In some embodiments, the high-frequency carrier signal an output of a matching network, as understood by one of skill in the art.

In the illustrated embodiment, multiphase filter 380 includes capacitors CF1-CFN and switches SW1-SW5, capacitor C5 and switch SW5. As understood by those of skill in the art, the connection relationship between capacitors CF1-CFN and switches SW1-SW5 such that the capacitors CF1-CFN may be connected to ground and switches SW1-SW5 may be connected to LNA 310. As understood, at least from FIG. 3, by those of skill in the art, using communication bus Ctrl, the controller provides a signal that causes the switches SWF1-SWFN to switch at a frequency, and multiphase filter 380 passes signals of frequencies less than the switching frequency from the input of LNA 310 to ground, and passes signals of frequencies greater than the switching frequency from the input of LNA 310 to ground. Accordingly, signals at the switching frequency are passed to the LNA 310.

The high-frequency carrier signal may also include a blocker signal, such as a high power signal also modulating the high-frequency carrier signal near the frequency of the information signal. Low noise amplifier 310 may be any low noise amplifier or amplifier, as understood by those of skill in the art.

In response to the output from the low noise amplifier 310, and in response to control signals from controller 370, multi-phase mixer 320 down converts the signal from the low noise amplifier 310. In some embodiments, the resulting initial baseband signals include information of the low frequency information signal and of the blocker signal.

The baseband signals may then be processed by optional buffers 330-1, 330-2 . . . 330-N, which buffer the signals, as understood by those of ordinary skill in the art. Because of the blocker signal, signals at the optional buffers 330-1, 330-2 . . . 330-N may exceed an input or output range limit, such that signals at the inputs, the outputs, or internal to the optional buffers 330-1, 330-2 . . . 330-N experience clipping. Using techniques known to those of skill in the art, the clipping may be detected, and communicated to controller 370. In response to the detected clipping, controller 370 may generate control signals for optional buffers 330-1, 330-2 . . . 330-N to attenuate the baseband signals such that the signal range limit is no longer exceeded, and the clipping stops. Additionally or alternatively, in response to the detected clipping, controller 370 may generate control signals for multi-phase mixer 320 which cause multi-phase mixer 320 to attenuate the baseband signals such that the signal range limit is no longer exceeded, and the clipping stops. Additionally or alternatively, in response to the detected clipping, controller 370 may generate control signals for multiphase filter 380 which cause multiphase filter 380 to attenuate the baseband signal such that the signal range limit is no longer exceeded, and the clipping stops.

In some embodiments, optional buffers 330-1, 330-2 . . . 330-N do not detect whether the baseband signal exceeds a signal range limit.

The baseband signals are then processed by the low-pass filters 340-1, 340-2 . . . 340-N, which filter the signals, as understood by those of ordinary skill in the art. Because of the blocker signal, signals at the low-pass filters 340-1, 340-2 . . . 340-N may exceed an input or output range limit, such that signals at the input, the output, or internal to the low-pass filters 340-1, 340-2 . . . 340-N experience clipping. Using techniques known to those of skill in the art, the clipping may be detected, and communicated to controller 370. In response to the detected clipping, controller 370 may generate control signals for low-pass filters 340-1, 340-2 . . . 340-N to attenuate the baseband signal such that the signal range limit is no longer exceeded, and the clipping stops. Additionally or alternatively, in response to the detected clipping, controller 370 may generate control signals for optional buffers 330-1, 330-2 . . . 330-N to attenuate the baseband signal such that the signal range limit is no longer exceeded, and the clipping stops. Additionally or alternatively, in response to the detected clipping, controller 370 may generate control signals for multi-phase mixer 320 which cause multi-phase mixer 320 to attenuate the baseband signals such that the signal range limit is no longer exceeded, and the clipping stops. Additionally or alternatively, in response to the detected clipping, controller 370 may generate control signals for multiphase filter 380 which cause multiphase filter 380 to attenuate the baseband signal such that the signal range limit is no longer exceeded, and the clipping stops.

In some embodiments, the low-pass filters 340-1, 340-2 . . . 340-N do not detect whether the baseband signal exceeds a signal range limit.

The baseband signals are then processed by the combiner 390, which combines the signals to generate baseband I and Q signals, using techniques such as weighted harmonic rejection, as understood by those of ordinary skill in the art. Other combining techniques may be used. Because of the blocker signal, signals at the combiner 390 may exceed an input or output range limit, such that signals at the input, the output, or internal to the combiner 390 experience clipping. Using techniques known to those of skill in the art, the clipping may be detected, and communicated to controller 370. In response to the detected clipping, controller 370 may generate control signals for combiner 390 to attenuate the baseband signal such that the signal range limit is no longer exceeded, and the clipping stops. Additionally or alternatively, in response to the detected clipping, controller 370 may generate control signals for low-pass filters 340-1, 340-2 . . . 340-N to attenuate the baseband signal such that the signal range limit is no longer exceeded, and the clipping stops. Additionally or alternatively, in response to the detected clipping, controller 370 may generate control signals for optional buffers 330-1, 330-2 . . . 330-N to attenuate the baseband signal such that the signal range limit is no longer exceeded, and the clipping stops. Additionally or alternatively, in response to the detected clipping, controller 370 may generate control signals for multi-phase mixer 320 which cause multi-phase mixer 320 to attenuate the baseband signals such that the signal range limit is no longer exceeded, and the clipping stops. Additionally or alternatively, in response to the detected clipping, controller 370 may generate control signals for multiphase filter 380 which cause multiphase filter 380 to attenuate the high-frequency carrier signal such that the signal range limit is no longer exceeded, and the clipping stops.

In some embodiments, using circuitry understood by those of skill in the art, the functionality of low-pass filters 340-1, 340-2 . . . 340-N may be included in combiner 390, such that a low-pass filter/combiner circuit receives baseband signals from either the multi-phase mixer 320 or the optional buffers 330-1, 330-2 . . . 330-N, and both filters the baseband signals, and generates corresponding I and Q signals.

The baseband I and Q signals are then processed by the variable gain amplifiers 350-1 and 350-2. Because of the blocker signal, signals at the variable gain amplifiers 350-1 and 350-2 may exceed an input or output range limit, such that signals at the input, the output, or internal to the variable gain amplifiers 350-1 and 350-2 experience clipping. Using techniques known to those of skill in the art, the clipping may be detected, and communicated to controller 370. In response to the detected clipping, controller 370 may generate control signals for variable gain amplifiers 350-1 and 350-2 to attenuate the baseband signal such that the signal range limit is no longer exceeded, and the clipping stops. Additionally or alternatively, in response to the detected clipping, controller 370 may generate control signals for combiner 390 to attenuate the baseband signal such that the signal range limit is no longer exceeded, and the clipping stops. Additionally or alternatively, in response to the detected clipping, controller 370 may generate control signals for low-pass filters 340-1, 340-2 . . . 340-N to attenuate the baseband signal such that the signal range limit is no longer exceeded, and the clipping stops. Additionally or alternatively, in response to the detected clipping, controller 370 may generate control signals for optional buffers 330-1, 330-2 . . . 330-N to attenuate the baseband signal such that the signal range limit is no longer exceeded, and the clipping stops. Additionally or alternatively, in response to the detected clipping, controller 370 may generate control signals for multi-phase mixer 320 which cause multi-phase mixer 320 to attenuate the baseband signals such that the signal range limit is no longer exceeded, and the clipping stops. Additionally or alternatively, in response to the detected clipping, controller 370 may generate control signals for multiphase filter 380 which cause multiphase filter 380 to attenuate the baseband signal such that the signal range limit is no longer exceeded, and the clipping stops.

In some embodiments, variable gain amplifiers 350-1 and 350-2 do not detect whether the baseband signal exceeds a signal range limit.

The baseband signals are then processed by the digital signal processor 360. Because of the blocker signal, signals at the digital signal processor 360 may exceed an input or output range limit, such that signals at the input, the output, or internal to the digital signal processor 360 experience clipping. Using techniques known to those of skill in the art, the clipping may be detected, and communicated to controller 370. In response to the detected clipping, controller 370 may generate control signals for digital signal processor 360 to attenuate the baseband signal such that the signal range limit is no longer exceeded, and the clipping stops. Additionally or alternatively, in response to the detected clipping, controller 370 may generate control signals for variable gain amplifiers 350-1 and 350-2 to attenuate the baseband signal such that the signal range limit is no longer exceeded, and the clipping stops. Additionally or alternatively, in response to the detected clipping, controller 370 may generate control signals for low-pass filters 340-1, 340-2 . . . 340-N to attenuate the baseband signal such that the signal range limit is no longer exceeded, and the clipping stops. Additionally or alternatively, in response to the detected clipping, controller 370 may generate control signals for optional buffers 330-1, 330-2 . . . 330-N to attenuate the baseband signal such that the signal range limit is no longer exceeded, and the clipping stops. Additionally or alternatively, in response to the detected clipping, controller 370 may generate control signals for multi-phase mixer 320 which cause multi-phase mixer 320 to attenuate the baseband signals such that the signal range limit is no longer exceeded, and the clipping stops. Additionally or alternatively, in response to the detected clipping, controller 370 may generate control signals for multiphase filter 380 which cause multiphase filter 380 to attenuate the baseband signal such that the signal range limit is no longer exceeded, and the clipping stops.

In some embodiments, the digital signal processor 360 does not detect whether the baseband signal exceeds a signal range limit.

As understood by those of skill in the art, the control signals from controller 370 may cause one or more gain elements to attenuate the blocker signal. Additionally or alternatively, as understood by those of skill in the art, the control signals from controller 370 may cause one or more filtering elements to filter the blocker signal by, for example, moving a pole of the one or more filtering elements.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:

1. A receiver circuit, comprising:
   an amplifier configured to generate an RF signal based on a received signal, wherein the RF signal comprises an information signal and a blocker signal modulating an RF carrier frequency;
   an RF filter connected to the amplifier, wherein the RF filter is configured to selectively attenuate the blocker signal in response to a control signal; and
   another circuit configured to detect an indication of the blocker signal, and to generate the control signal in response to the indication being detected, wherein the other circuit comprises a variable gain amplifier configured to generate a clipped output signal in response to one or more signals at the variable gain amplifier exceeding an input or output range limit.

2. The receiver circuit of claim 1, wherein the RF filter comprises a capacitor having a terminal connected to or selectively connected to an input of the amplifier configured to receive the received signal.

3. The receiver circuit of claim 2, wherein the RF filter comprises a switch connected to ground or the amplifier.

4. The receiver circuit of claim 1, further comprising a multiphase mixer, configured to receive the RF signal and to downconvert the RF signal to a baseband signal, wherein the baseband signal comprises the information signal and the blocker signal modulating a baseband carrier frequency, and wherein the baseband carrier frequency is less than the RF carrier frequency.

5. The receiver circuit of claim 1, wherein the other circuit comprises a controller configured to generate the control signal in response to the clipped output signal of the variable gain amplifier.

6. The receiver circuit of claim 1, wherein the other circuit comprises an analog-to-digital converter configured to generate a clipped digital signal in response to the clipped output signal of the variable gain amplifier.

7. The receiver circuit of claim 6, wherein the other circuit comprises a controller configured to generate the control signal in response to the clipped digital signal of the analog-to-digital converter.

8. A method of operating a receiver circuit, the receiver circuit comprising:
   an amplifier;
   an RF filter connected to the amplifier; and
   another circuit comprising a variable gain amplifier, the method comprising:
   with the amplifier, generating an RF signal based on a received signal, wherein the RF signal comprises an information signal and a blocker signal modulating an RF carrier frequency;
   with the RF filter, selectively attenuating the blocker signal with the RF filter, attenuating the blocker signal in response to a control signal;
   with the other circuit, detecting an indication of the blocker signal; and
   with the other circuit, generating the control signal in response to the indication being detected; and
   with the variable gain amplifier, generating a clipped output signal in response to one or more signals at the variable gain amplifier exceeding an input or output range limit.

9. The method of claim 8, wherein the RF filter comprises a capacitor having a terminal connected to or selectively connected to an input of the amplifier configured to receive the received signal.

10. The method of claim 9, wherein the RF filter comprises a switch connected to ground or the amplifier.

11. The method of claim 8, wherein the receiver circuit comprises a multiphase mixer, and the method further comprises:
    with the multiphase mixer, receiving the RF signal; and
    with the multiphase mixer, downconverting the RF signal to a baseband signal, wherein the baseband signal comprises the information signal and the blocker signal modulating a baseband carrier frequency, and wherein the baseband carrier frequency is less than the RF carrier frequency.

12. The method of claim 8, wherein the other circuit further comprises a controller, and wherein the method further comprises:
    with the controller, generating the control signal in response to the clipped output signal of the variable gain amplifier.

13. The method of claim 8, wherein the other circuit comprises an analog-to-digital converter, and wherein the method further comprises, with the analog-to-digital converter, generating a clipped digital signal in response to the clipped output signal of the variable gain amplifier.

14. The method of claim 13, wherein the other circuit further comprises a controller, and wherein the method further comprises:
    with the controller, generating the control signal in response to the clipped digital signal of the analog-to-digital converter.

* * * * *